(12) United States Patent
Wang

(10) Patent No.: US 7,060,594 B2
(45) Date of Patent: Jun. 13, 2006

(54) MEMORY DEVICE AND METHOD OF MANUFACTURING INCLUDING DEUTERATED OXYNITRIDE CHARGE TRAPPING STRUCTURE

(75) Inventor: Szu-Yu Wang, Shiaugang Chiu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/968,306

(22) Filed: Oct. 19, 2004

(65) Prior Publication Data

US 2006/0084242 A1    Apr. 20, 2006

(51) Int. Cl.
*H01L 21/322* (2006.01)

(52) U.S. Cl. .................. 438/475; 438/258; 438/954

(58) Field of Classification Search ............... 438/475, 438/474, 257, 258, 680, 905, 910, 954
See application file for complete search history.

(56) References Cited

U.S. PATENT DOCUMENTS

| | | | |
|---|---|---|---|
| 5,885,870 A | 3/1999 | Maiti et al. | |
| 5,972,765 A | 10/1999 | Clark et al. | |
| 6,114,258 A | 9/2000 | Miner et al. | |
| 6,159,866 A | 12/2000 | Gronet et al. | |
| 6,218,245 B1 * | 4/2001 | Xiang et al. | 438/258 |
| 6,221,705 B1 | 4/2001 | Rost et al. | |
| 6,228,779 B1 | 5/2001 | Bloom et al. | |
| 6,380,033 B1 | 4/2002 | He et al. | |
| 6,413,881 B1 | 7/2002 | Aronowitz et al. | |
| 6,417,570 B1 | 7/2002 | Ma et al. | |
| 6,534,809 B1 * | 3/2003 | Moise et al. | 257/295 |
| 6,559,007 B1 | 5/2003 | Weimer | |
| 6,670,241 B1 * | 12/2003 | Kamal et al. | 438/258 |
| 6,674,151 B1 | 1/2004 | Chetlur et al. | |
| 6,677,213 B1 | 1/2004 | Ramkumar et al. | |

OTHER PUBLICATIONS

Silvestri, H.H., et al. "Reduction of Microdefects Responsible for Degradation of Thin Gate Oxides," Final Report 1998-99 for MICRO Project 98-056, Industrial Sponsor: Applied Materials, Inc., 4 pages.

(Continued)

*Primary Examiner*—David Nhu
(74) *Attorney, Agent, or Firm*—Haynes Beffel & Wolfeld; Mark A. Haynes

(57) ABSTRACT

A method for manufacturing a charge storage stack including a bottom dielectric layer, a charge trapping structure on the bottom dielectric layer, and a top dielectric layer, each comprising silicon oxynitride, are formed using reactant gases that comprise hydrogen, where the hydrogen comprises at least 90 percent deuterium isotope. The bottom dielectric layer, charge trapping structure, and top dielectric layer each have respective relative concentrations of oxygen and nitrogen. The relative concentration of nitrogen in the charge trapping structure is high enough for the material to act as a charge trapping structure with an energy gap that is lower than the energy gaps in the bottom dielectric layer and the top dielectric layer. The presence of oxygen in the charge trapping structure reduces the number of available dangling bonding sites, and thereby reduces the number of hydrogen inclusions in the structure.

15 Claims, 3 Drawing Sheets

OTHER PUBLICATIONS

Al-Shareef, H.N., et al., "Device performance of in situ steam generated gate dielectric nitrided by remote plasma nitridation," Applied Physics Letters 78(24), Jun. 11, 2001, 3875-3877.

Kwon, Hyungshin, et al., "Electrical characteristics of ultrathin gate oxide prepared by postoxidation annealing in ND3," Applied Physics Letters 76(6), Feb. 7, 2000, 772-773.

Ramachandran, Balasubramanian, et al., "Beyond the 100nm node: Single-Wafer RTP," Applied Materials Solid State Technology, May 2003. Article can be found at http://www.myappliedmaterials.net/products/assets/front_end/052003_single_wafer_rtp.pdf.

Karamcheti, A, et al., "Characterization of Ultrathin Gate Dielectrics Formed by In-Situ Steam Generation with Nitrogen Postprocessing," Journal of Electronic Materials 31(2), 2002, p. 124.

Karamcheti, A, et al., "Silicon Oxynitride Films as a Segue to the High-K Era," Semiconductor Fabtech, 12th Ed., Jul. 1000, 207-214.

Kuppurao, Satheesh, et al., "In situ steam generation: A new rapid thermal oxidation technique," Applied Materials, Thermal Processing, Solid State Technology, Jul. 2000.

Maiti, Bikas, et al., "Reoxidizated, Nitric Oxide (ReoxNO) Process and its Effect on the Dielectric Reliability of the LOCOS Edge," 1995 Symposium on VLSI Technology Digest of Technical Papers, 63-64.

Zonca, R, et al., "Ultra Thin NO/N20 Oxynitride Dielectric for Advanced Flash Memory Application: Single Wafer and Batch Technology," Mat. Res. Soc. Symp. Proc., editors T. Matikas, N. Meyendorf, G. Baaklini, R. Gilmore, 591 (2000), 6 pages.

Huff, H.R. and Bevan, M., Assemblers of ad hoc meeting notes, Questions at the International Workshop on Gate Insulators (IWG1 (2001) [H. Iawi] Panel Discussion, Utilized at the Ad Hoc Meeting on High-K Gate Dielectrics at the Semiconductor Interface Specialists Conference (SISC) 2001 [Nov. 30, 2001], 3 pages.

* cited by examiner

MEMORY DEVICE AND METHOD OF MANUFACTURING INCLUDING DEUTERATED OXYNITRIDE CHARGE TRAPPING STRUCTURE

BACKGROUND OF THE INVENTION

1. Field of the Invention

The present invention relates to nonvolatile memory devices and methods for manufacturing such devices.

2. Description of Related Art

Electrically programmable and erasable nonvolatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names NROM, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Conventional SONOS devices use ultra-thin bottom oxide, e.g. less than 3 nanometers, and a bias arrangement that causes direct tunneling for channel erase. Although the erase speed is fast using this technique, the charge retention is poor due to the charge leakage through ultra-thin bottom oxide.

NROM devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell.

In addition, charge trapping memory devices capture electrons in a charge trapping layer in both shallow and deep energy levels. Electrons trapped in shallow levels tend to de-trap faster than those electrons in deeper energy level traps. The shallow level electrons are a significant source of charge retention problems. In order to keep good charge retention, deeply trapped electrons are preferred.

For commercial products it is desirable for such devices to hold data for at least ten years without loss. However, leakage of trapped charge, from shallower and deeper traps both, occurs in such devices due to defects in the materials which accumulate over long use, or which are inherent in the structures. One known class of defects in charge trapping structures is hydrogen inclusions in dielectric layers and structures. The hydrogen inclusion occupies a weak bond in a silicon material, such as silicon dioxide and silicon nitride, and can dissociate from the lattice structure of the dielectric and become a charge carrier, which then can contribute to charge loss. FIG. 1 provides a graphical representation of a typical memory cell based on charge trapping structures. The memory cell comprises a terminal 10 acting as a source, a terminal 11 acting as a drain and a channel region 12 in the substrate. A bottom dielectric layer 13 overlies the channel region 12 and portions of the source and drain terminals 10, 11. A charge trapping layer 14 overlies the bottom dielectric and a top dielectric 15 overlies the charge trapping layer 14. A gate electrode comprising a polysilicon layer 16 and a silicide layer 17 lie over the top dielectric layer 15. A small region of the bottom dielectric layer 13, charge trapping layer 14 and top dielectric layer are expanded heuristically in the region 20 on the drawing. Silicon atoms are shown schematically with four lines representing the valence electrons normally available for bonding, including the three pronged lines coupled on one side of the Si symbols, with one prong on the other side. Most of the bonding sites are occupied in the top and bottom dielectrics by oxygen. However, some hydrogen atoms attach to dangling bonding sites in the lattice structure, becoming trapped hydrogen inclusions in the dielectric, illustrated by the H in a circle. In the charge trapping layer 14, most of the bonding sites are occupied by nitrogen, with some hydrogen inclusions.

A number of investigators have looked at replacing hydrogen inclusions with deuterium isotopes of hydrogen, which form stronger bonds with silicon and do not dissociate and become charge carriers as easily. See for example U.S. Pat. No. 6,670,241 entitled SEMICONDUCTOR MEMORY WITH DEUTERATED MATERIALS, by Kamal et al. Kamal et al. suggests that the top and bottom oxides in an ONO charge trapping layer, as well as overlying structures such as polysilicon wordlines, and the silicon nitride charge trap, all of which contain silicon, can be "deuterated" to improve charge retention characteristics of the memory cell. (See, column 5, lines 56–61, and column 4, lines 43–52.) However, improved processes and structures are desirable which can be applied to very small devices, and achieve long retention times.

SUMMARY OF THE INVENTION

The present invention provides a method for manufacturing a charge storage stack with improved data retention characteristics, applicable for use in very small memory devices. The method includes the formation of a stack including a bottom dielectric layer, a charge trapping structure on the bottom dielectric layer, and a top dielectric layer. The bottom dielectric layer, the charge trapping structure, and the top dielectric layer each comprise silicon oxynitride, and are formed using reactant gases that comprise hydrogen, where the hydrogen comprises at least 90 percent deuterium isotope. The bottom dielectric layer, charge trapping structure, and top dielectric layer include hydrogen inclusions which can be described for the purposes of description as being attached to dangling silicon bonding sites that result from manufacturing processes that include reaction gases comprising hydrogen. The bottom dielectric layer, charge trapping structure, and top dielectric layer each have respective relative concentrations of oxygen and nitrogen. The relative concentrations of nitrogen in the charge trapping structure is high enough for the material to act as a charge trapping structure with an energy gap that is lower than the energy gaps in the bottom dielectric layer and the top dielectric layer. The presence of oxygen in the charge trapping structure reduces the number of available dangling bonding sites, and thereby reduces the number of hydrogen inclusions in the structure. A combination of utilizing deuterium isotope in the reactant gases and silicon oxynitride as the charge trapping structure, substantially reduces the number of hydrogen inclusions, and of those inclusions, reduces the number which are not deuterium isotope.

The top and bottom dielectrics are formed in embodiments of the described process using radical oxidation processes that include in situ radical formation, such as in situ steam generation ISSG, resulting in high-quality ultrathin layers of oxide, including bottom dielectric layers less than 7 nanometers thick in some embodiments, and less than 3 nanometers thick in other embodiments. The layers of oxide can be treated with, or formed in the presence of, a nitrogen containing material. The nitrogen containing material comprises hydrogen in some embodiments, in which the hydrogen comprises at least 90 percent deuterium isotope. Use of nitrogen containing oxides in the bottom and top dielectric layers provides improved resistance to breakdown, including resistance to boron penetration which degrades device durability. The use of in situ radical oxidation processes, combined with deuterated reactant gas and nitrogen treatments in the top and bottom dielectric further enhances performance of the charge storage stack.

The technology described herein provides a new memory device with improved durability and charged retention characteristics. A memory device comprises the terminal, such as a source or drain having a first conductivity type in a substrate, the region in the substrate adjacent the terminal having a second conductivity type, the bottom dielectric over portions of the terminal in the region, the charged storage structure on the bottom dielectric, and the top dielectric over the charged storage structure. As mentioned above, the bottom dielectric layer, the charge trapping structure, and the top dielectric layer each comprise silicon oxynitride, and are formed using reactant gases that comprise hydrogen, where the hydrogen comprises at least 90 percent deuterium isotope. The bottom dielectric layer, charge trapping structure, and top dielectric layer include hydrogen inclusions which can be described for the purposes of description as being attached to dangling silicon bonding sites that result from manufacturing processes that include reaction gases comprising hydrogen. The bottom dielectric layer, charge trapping structure, and top dielectric layer each have respective relative concentrations of oxygen and nitrogen. The relative concentrations of nitrogen in the charge trapping structure is high enough for the material to act as a charge trapping structure with an energy gap that is lower at the interfaces between the layers in the stack, than the energy gaps at the interfaces in the bottom dielectric layer and in the top dielectric layer.

Other aspects and advantages of the present invention can be seen on review of the drawings, the detailed description and the claims, which follow.

DETAILED DESCRIPTION

Figure 1:
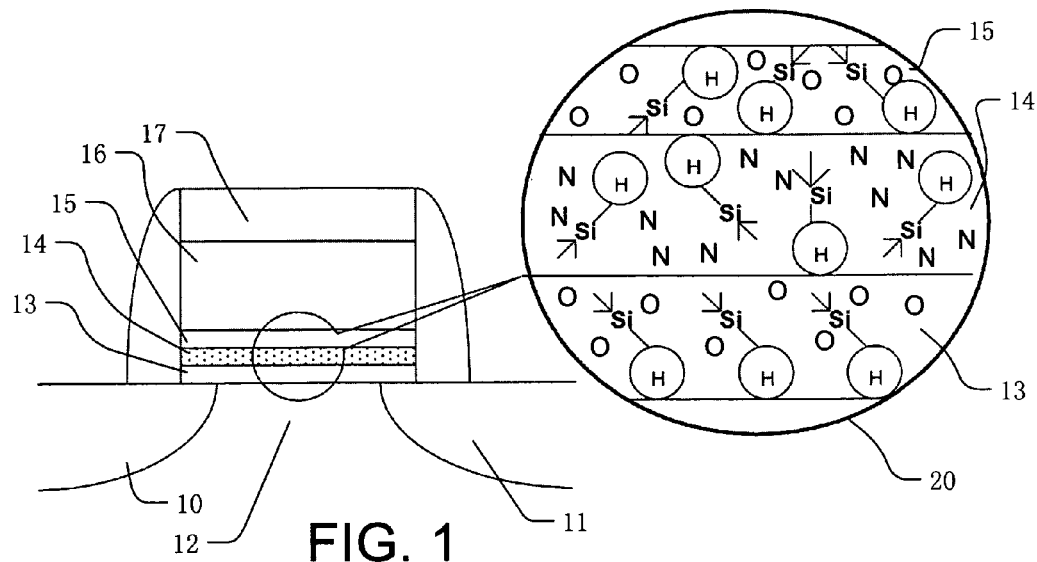
FIG. 1 is a simplified diagram of a prior art memory device with hydrogen inclusions.
Figure 2:
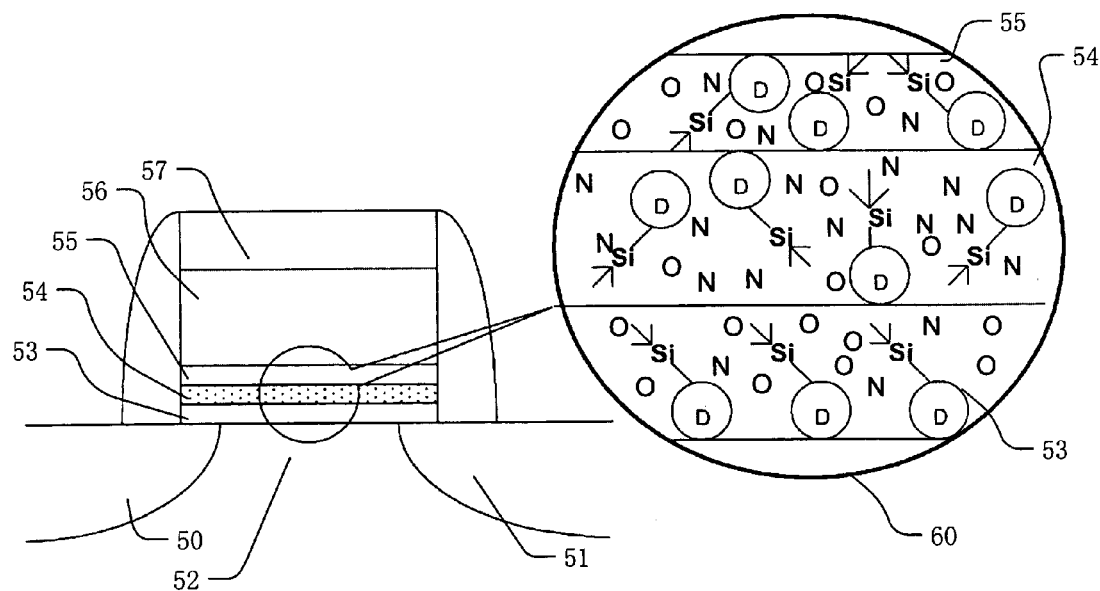
FIG. 2 is a diagram of a memory device including a stack of silicon oxynitride layers with hydrogen inclusions that comprise deuterium isotope, configured as a charge storage device.
Figure 3:
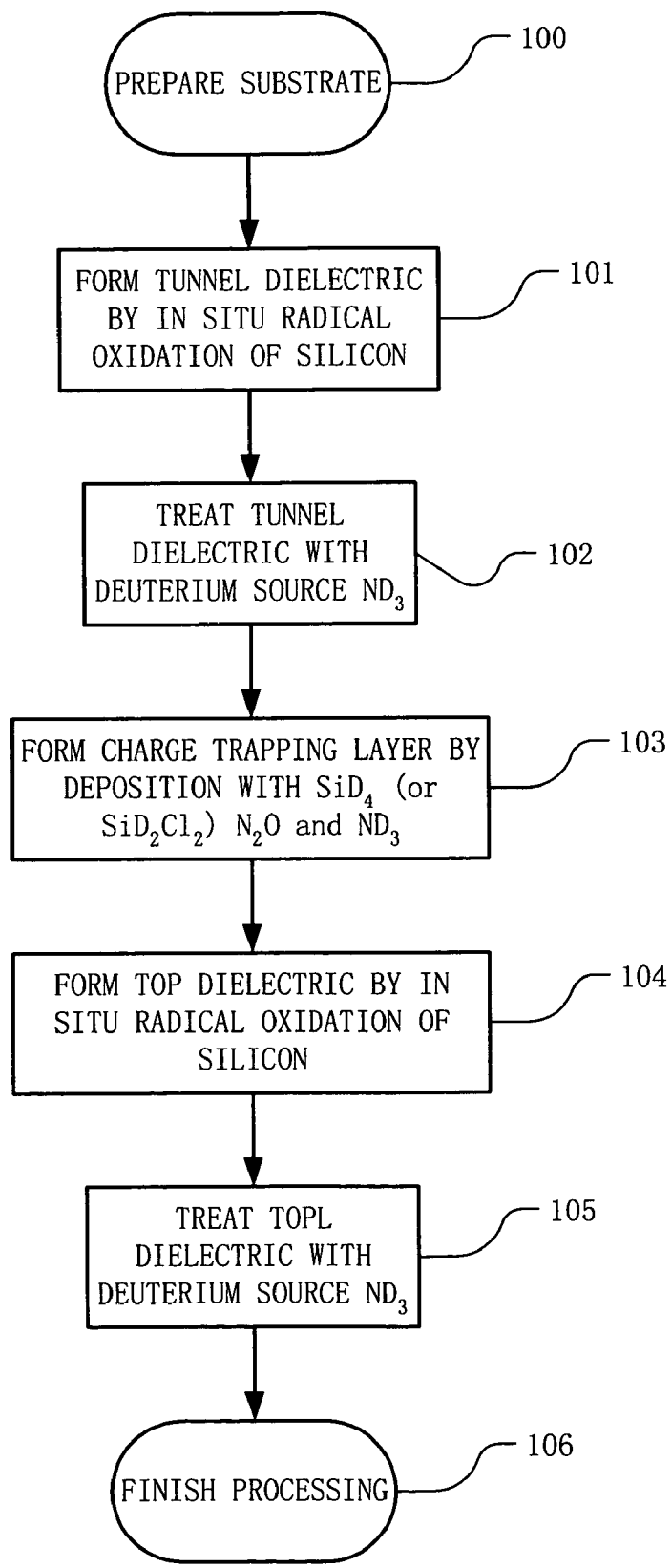
FIG. 3 is a flowchart of a representative process for manufacturing a memory device like that shown in FIG. 2.
Figure 4:
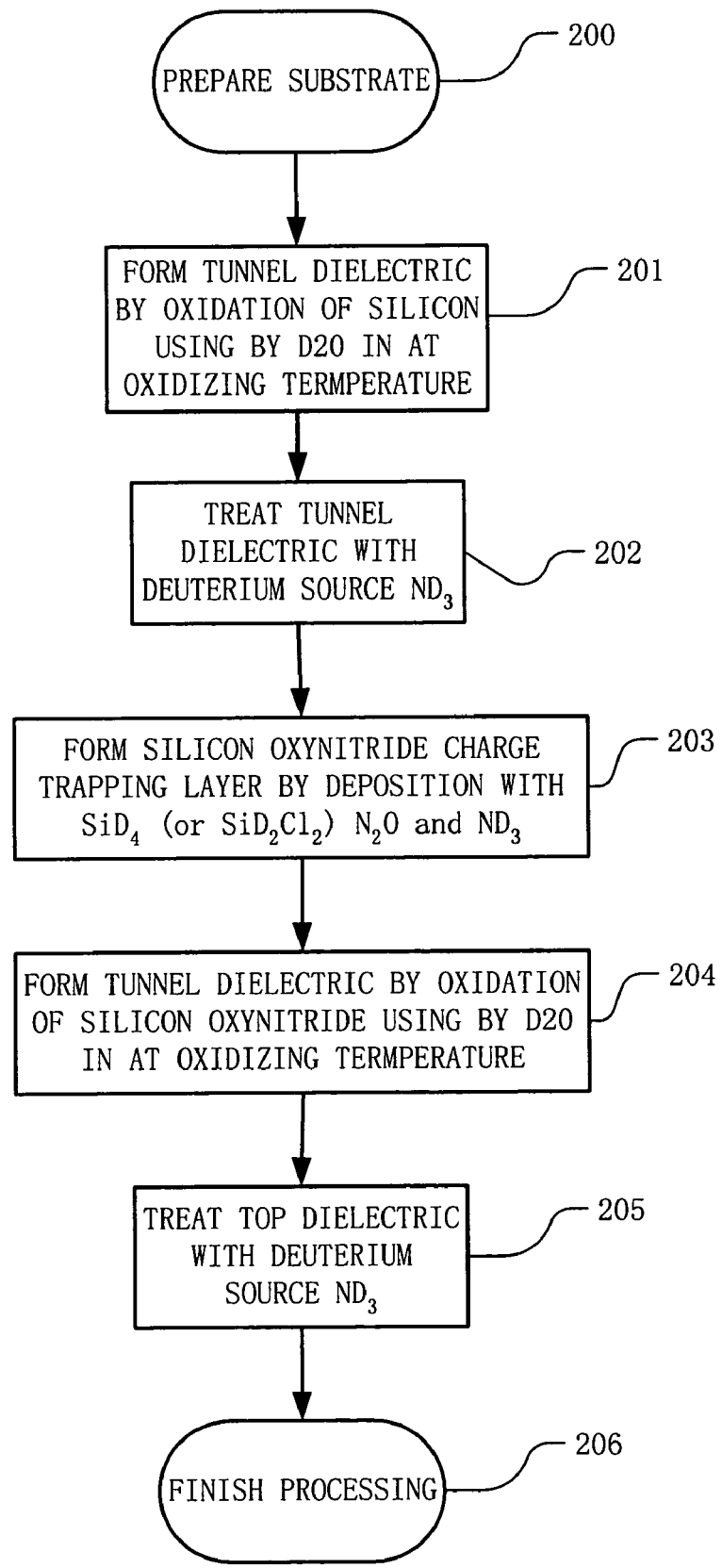
FIG. 4 is a flowchart of another representative process for manufacturing a memory device like that shown in FIG. 2.

A detailed description of embodiments of the present invention is provided with reference to the FIGS. 2, 3 and 4.

FIG. 2 provides a graphical representation of a memory cell based on a charge storage stack comprising deuterated oxynitride layers. The memory cell comprises a terminal 50 acting as a source, a terminal 51 acting as a drain and a channel region 52 in the substrate. A bottom dielectric layer 53 overlies the channel region 52 and portions of the source and drain terminals 50, 51. A charge trapping layer 54 overlies the bottom dielectric and a top dielectric 55 overlies the charge trapping layer 54. A gate electrode comprising a polysilicon layer 56 and a silicide layer 57 lie over the top dielectric layer 55. A small region of the bottom dielectric layer 53, charge trapping layer 54 and top dielectric layer are expanded heuristically in the region 60 on the drawing. Silicon atoms are shown schematically with four lines representing the valence electrons normally available for bonding, including the three pronged lines coupled on one side of the Si symbols, with one prong on the other side. Most of the bonding sites are occupied in the top and bottom dielectrics by oxygen, with a number of bonding sites occupied by nitrogen. However, some hydrogen atoms, consisting of deuterium isotope, attach to dangling bonding sites in the lattice structure, becoming trapped hydrogen inclusions in the dielectric, illustrated by the D in a circle. In the charge trapping layer 54, most of the bonding sites are occupied by nitrogen, with a number of bonding sites occupied by oxygen. Some hydrogen inclusions that consist of deuterium isotope are trapped in the top and bottom dielectrics. The bottom dielectric layer, charge trapping structure, and top dielectric layer each have respective relative concentrations of oxygen and nitrogen. The ratio of concentrations of nitrogen to oxygen in the charge trapping structure is high enough for the material to act as a charge trapping structure with an energy gap that is lower at the interfaces between the layers in the stack, than the energy gaps at the interfaces in the bottom dielectric layer and in the top dielectric layer.

FIG. 3 is a simplified flow chart for a manufacturing process for a deuterated oxynitride charge storage stack. The flow chart begins with preparing the substrate for bottom oxide formation (block 100), according to well known procedures that depend on a particular manufacturing flow, including, for a couple of examples, definition of source and drain terminals, removal of sacrificial oxides, and other steps leading up to bottom oxide formation. Next the tunnel dielectric layer acting as the bottom dielectric in the charge storage stack is formed (block 101) using an in situ radical oxidation procedure such as in situ steam generation ISSG. Embodiments of bottom oxide formation processes include radical formation according to a formula $D_2+O_2 \rightarrow O^*+OD^*$, caused by introducing a mixture of deuterium $D_2$ and oxygen $O_2$ into a reaction chamber under relatively low pressure (less than 100 torr for example) with a temperature at the substrate between about 850 and 1150 degrees C, where reactant oxygen $O^*$ and hydroxyl $OD^*$ radicals are formed, and react with the substrate to form high quality silicon oxide. The ratio of concentrations $D_2/(D_2+O_2)$ can be in a range up to about 0.4, for a 40% $D_2$ concentration in the mixture. In one embodiment the reaction chamber comprises a rapid thermal process RTP type chamber, as applied for ISSG processes.

After bottom oxide formation, the dielectric layer is annealed in the presence of a nitrogen source and a source of deuterium, such as ammonium or ammonia, where the hydrogen atoms consist essentially of deuterium isotope (block 102). Alternative nitrogen sources include $N_2$ and $N_2O$. Alternative deuterium sources include $D_2$. The annealing process results in incorporation of a relatively small concentration of nitrogen atoms in the bottom dielectric layer.

Next, the charge trapping layer is formed (block 103). The charge trapping layer comprises silicon oxynitride with a relatively high concentration of nitrogen. An approach to manufacturing the charge trapping layer includes introducing a mixture of reactant gases including nitrogen, silicon, oxygen and deuterium sources into chamber. In one example the reactant gases include nitrogen oxide $N_2O$, ammonia, and silane or a silane derivative at a relatively low pressure (e.g. less than 400 torr using a rapid thermal chemical vapor deposition CVD chamber or other single-wafer CVD chamber) at a temperature on the substrate of between about 650 and 850 degrees C. For example, $N_2O+ND_3+SiD_2Cl_2$ or $SiD_4$ yields $SiO_xN_y$+some bi-products in this environment. The gas flow ratio is adjusted to achieve the desired concentrations of Si, O and N in the oxynitride layer. To act as a charge trapping layer the concentration of nitrogen in the $SiO_xN_y$ is significant, and in some embodiments y is much greater than x, so that the layer approaches a silicon nitride with some extra bonding sites consumed by oxygen, displacing potential sites for hydrogen inclusions.

The top dielectric layer is formed in the next step (block 104) by in situ generated radical oxidation, as described above with respect to the bottom dielectric layer. The top dielectric layer is then annealed in the presence of nitrogen and deuterium (block 105) to form a top oxynitride. Processing is then finished (block 106), with subsequent layer and pattern operations forming the gates, metallization, and so on.

FIG. 4 is a simplified flow chart for another manufacturing process for a deuterated oxynitride charge storage stack. The flow chart begins with preparing the substrate for bottom oxide formation (block 200), according to well known procedures that depend on a particular manufacturing flow, including, for a couple of examples, definition of source and drain terminals, removal of sacrificial oxides, and other steps leading up to bottom oxide formation. Next the tunnel dielectric layer acting as the bottom dielectric in the charge storage stack is formed (block 201) introducing a mixture of deuterium $D_2$ and oxygen $O_2$ into a furnace to form $D_2O$ with a temperature at the substrate sufficient to cause oxidation of the silicon to form high quality silicon oxide. In one embodiment the reaction chamber comprises a rapid thermal process RTP type chamber instead of a furnace.

After bottom oxide formation, the dielectric layer is annealed in the presence of a nitrogen source and a source of deuterium, such as ammonium or ammonia, where the hydrogen atoms consist essentially of deuterium isotope (block 202). Alternative nitrogen sources include $N_2$ and $N_2O$. Alternative deuterium sources include $D_2$. The annealing process results in incorporation of a relatively small concentration of nitrogen atoms in the bottom dielectric layer.

Next, the charge trapping layer is formed (block 203), using processes described above with reference to step 103 of FIG. 3. The charge trapping layer comprises silicon oxynitride with a relatively high concentration of nitrogen.

The top dielectric layer is formed in the next step (block 204) by $D_2O$ oxidation of the silicon oxynitride charge trapping layer. The process applied is like that described above with respect to the bottom dielectric layer. The top dielectric layer is then annealed in the presence of nitrogen and deuterium (block 205) to form a top oxynitride. Processing is then finished (block 206), with subsequent layer and pattern operations forming the gates, metallization, and so on.

The commercial gases $SiD_4$, $SiD_2Cl_2$, $ND_3$, or $D_2$ are considered almost "pure" deuterium. Thus, the hydrogen isotope is considered to be almost absent in the commercial gases. In embodiments of the processes described herein, a silane mixture including for example, 10%, or less, SiH4 with at least 90% $SiD_4$ might be used, although greater purity of deuterium sources is desirable in other embodiments. For the purpose of this description, the hydrogen in the reactant gases consists essentially of deuterium isotope, the hydrogen in a gas mixture is considered to consist essentially of deuterium isotope, if hydrogen atoms in the gas mixture include at least 90% deuterium, with 10%, or less, other isotopes of hydrogen.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of manufacturing a charge storage structure for an integrated circuit memory device, the method comprising:
    forming a bottom dielectric layer by oxidizing silicon by exposure of the silicon to oxidizing radicals, including in situ formation of radicals comprising hydrogen, wherein the hydrogen comprises at least 90% deuterium isotope;
    forming a charge trapping structure on the bottom dielectric layer, comprising silicon oxynitride utilizing a reactant gas comprising hydrogen, wherein the hydrogen comprises at least 90% deuterium isotope, and
    forming a top dielectric layer on the charge trapping layer by oxidizing silicon by exposure of the silicon to oxidizing radicals, including in situ formation of radicals comprising hydrogen, wherein the hydrogen comprises at least 90% deuterium isotope.

2. The method of claim 1, wherein the charge trapping structure comprises silicon nitride, and said forming a top dielectric layer comprises oxidation using in situ steam generation ISSG, and wherein said radicals comprise OD, where D is the deuterium isotope of hydrogen.

3. The method of claim 1, wherein said forming a charge trapping structure comprises deposition of silicon oxynitride, and said reactant gas comprises at least one of a silane and a silane derivative.

4. The method of claim 1, wherein said forming a charge trapping structure comprises deposition of silicon oxynitride, and said reactant gas comprises at least one of ammonia and ammonium.

5. The method of claim 1, wherein said forming a top dielectric layer comprises exposing the top dielectric layer to a nitrogen containing reactant gas.

6. The method of claim 1, wherein said forming a top dielectric layer comprises exposing the top dielectric layer to a reactant gas including at least one of ammonia and ammonium with hydrogen atoms in the reactant gas consisting essentially of deuterium isotope.

7. The method of claim 1, wherein the bottom dielectric layer is formed on a substrate comprising silicon, and said forming a bottom dielectric layer comprises oxidation of the substrate using in situ steam generation ISSG in the presence of a reactant gas comprising OD, where D is the deuterium isotope of hydrogen.

8. The method of claim 1, wherein the charge trapping structure has a sufficient concentration of nitrogen relative to oxygen to act as a charge trapping structure for a memory device, and the bottom dielectric and top dielectric layers comprise silicon oxynitride, having respective concentrations of nitrogen relative to oxygen that are less than said sufficient concentration.

9. A method of manufacturing a charge storage structure for an integrated circuit memory device, the method comprising:
   forming a bottom dielectric layer by oxidizing the substrate;
   forming a charge trapping structure on the bottom dielectric layer comprising silicon oxynitride utilizing a reactant gas comprising hydrogen, wherein the hydrogen comprises at least 90% deuterium isotope, and
   forming a top dielectric layer on the charge trapping layer by oxidizing silicon by exposure of the silicon to water at a temperature sufficient for oxidation, wherein hydrogen atoms in the water comprise at least 90% deuterium isotope.

10. The method of claim 9, wherein said forming a charge trapping structure comprises deposition of silicon oxynitride, and said reactant gas comprises at least one of a silane and a silane derivative.

11. The method of claim 9, wherein said forming a charge trapping structure comprises deposition of silicon oxynitride, and said reactant gas comprises at least one of ammonia and ammonium.

12. The method of claim 9, wherein said forming a top dielectric layer comprises exposing the top dielectric layer to a nitrogen containing reactant gas.

13. The method of claim 9, wherein said forming a top dielectric layer comprises exposing the top dielectric layer to a reactant gas including at least one of ammonia and ammonium with hydrogen atoms in the reactant gas consisting essentially of deuterium isotope.

14. The method of claim 9, wherein the bottom dielectric layer is formed on a substrate comprising silicon, and said forming a bottom dielectric layer comprises oxidizing silicon by exposure of the silicon to water at a temperature sufficient for oxidation, wherein hydrogen atoms in the water comprise at least 90% deuterium isotope.

15. The method of claim 9, wherein the charge trapping structure has a sufficient concentration of nitrogen relative to oxygen to act as a charge trapping structure for a memory device, and the bottom dielectric and top dielectric layers comprise silicon oxynitride, having respective concentrations of nitrogen relative to oxygen that are less than said sufficient concentration.

* * * * *